US009767721B2

(12) United States Patent
Kudo et al.

(10) Patent No.: US 9,767,721 B2

(45) Date of Patent: Sep. 19, 2017

(54) INSPECTION APPARATUS AND INSPECTION METHOD

(71) Applicant: Kabushiki Kaisha Nihon Micronics, Musashino-shi, Tokyo (JP)

(72) Inventors: Takayoshi Kudo, Musashino (JP); Katsuhiko Kimura, Musashino (JP); Takahiro Fukushi, Musashino (JP); Kazuyoshi Miura, Musashino (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 277 days.

(21) Appl. No.: 14/540,401

(22) Filed: Nov. 13, 2014

(65) Prior Publication Data

US 2015/0145541 A1 May 28, 2015

(30) Foreign Application Priority Data

Nov. 27, 2013 (JP) ................................ 2013-244549

(51) Int. Cl.
*G01R 31/00* (2006.01)
*G09G 3/00* (2006.01)

(52) U.S. Cl.
CPC .................................... *G09G 3/006* (2013.01)

(58) Field of Classification Search
CPC ................ G01R 31/26; G01R 31/2642; G01R 31/2648; G01R 31/2831; G01R 31/31702; G01R 1/0491; G01R 31/265; G01R 31/3012; G01R 31/318511
See application file for complete search history.

(56) References Cited

U.S. PATENT DOCUMENTS

2005/0110508 A1 5/2005 Kishida
2006/0038525 A1 2/2006 Kishida
2006/0152235 A1 * 7/2006 Fuchiyama ........ G01R 31/2886 324/750.26

FOREIGN PATENT DOCUMENTS

| | | | |
|---|---|---|---|
| JP | S63-179540 | | 7/1988 |
| JP | H01-138444 | | 5/1989 |
| JP | 2006023139 | | 1/2006 |
| JP | 2006-60038 | | 3/2006 |
| TW | 200530605 | A | 11/2004 |
| TW | 201113969 | A | 4/2011 |
| WO | 2008093904 | A1 | 8/2008 |

OTHER PUBLICATIONS

TW Office Action issued on Oct. 15, 2015, with English Translation.
Notification of Reasons for Refusal for JP App No. 2013-244549 dated May 30, 2017, 10 pgs.

* cited by examiner

*Primary Examiner* — Tung X Nguyen

(74) *Attorney, Agent, or Firm* — Procopio, Cory, Hargreaves & Savitch LLP

(57) ABSTRACT

An inspection apparatus and an inspection method capable of reducing the effect of noises are provided. An inspection apparatus according to the present invention includes a work table 26 on which an inspection panel 12 is placed, a probe unit 31 including a probe 38 that comes into contact with an electrode **12*a* of the inspection panel 12 placed on the work table 26, and a stage 11 that moves the work table 26 in order to bring the probe 38 into contact with the electrode 12*a* of the inspection panel 12 placed on the work table 26, in which the stage 11 is connected to the ground and supports the work table 26** through a resistive element.

12 Claims, 9 Drawing Sheets

INSPECTION APPARATUS AND INSPECTION METHOD

INCORPORATION BY REFERENCE

This application is based upon and claims the benefit of priority from Japanese patent application No. 2013-244549, filed on Nov. 27, 2013, the disclosure of which is incorporated herein in its entirety by reference.

BACKGROUND OF THE INVENTION

1. Field of the Invention

The present invention relates to an inspection apparatus and an inspection method.

2. Description of Related Art

After their manufacturing process, display panels usually undergo a lighting inspection for determining whether there are any defects such as pixel defects therein. In this lighting inspection, it is necessary to supply a drive signal to a liquid crystal panel, which is the object to be inspected. Further, a circuit inspection can be performed by performing an array inspection. For example, a drive signal is supplied to a mother glass substrate before it is cut into a plurality of sections. Therefore, the inspection apparatus is provided with, as its inspection station, an electric inspection apparatus including an inspection pedestal on which a liquid crystal panel, which is the object to be inspected, is placed in a state where its electrodes face upward, and a probe unit supported on a fixed frame body disposed above the object to be inspected.

As this type of an electric inspection apparatus, Japanese Unexamined Patent Application Publication No. 2006-23139 discloses an inspection apparatus for a liquid crystal panel. In this inspection apparatus, a liquid crystal panel is placed on a work table of an inspection stage. The inspection stage includes a driving pedestal capable of moving in XYZθ-directions and a rotating pedestal.

SUMMARY OF THE INVENTION

In such an inspection apparatus, when the work table is connected to the ground (GND), a capacitive coupling is formed between the work table and a device to be inspected. Specifically, as shown in FIG. 10, a capacitive coupling is formed between a device pattern 12*b* disposed in a panel 12 to be inspected (hereinafter referred to as "inspection panel 12") and a work table 26 made of conductive material. Therefore, part of the measurement current flows to the GND through the work table 26. There is a problem that the current leaking through the capacitive coupling causes noises and hence affects the measurement results.

The present invention has been made in view of the above-described problem, and an object thereof is to provide an inspection apparatus and an inspection method capable of reducing the effect of noises.

A first exemplary aspect of the present invention is an inspection apparatus including: a work table on which an object to be inspected is placed; a probe unit including a probe that comes into contact with the object placed on the work table; and a stage that moves the work table in order to bring the probe into contact with an electrode of the object placed on the work table, in which the stage is connected to ground, and the stage supports the work table through a resistive element. This configuration makes it possible to reduce the current that leaks from the inspection panel to the GND through the work table and thereby to reduce the effect of noises.

In the above-described inspection apparatus, the stage may support the work table through a plurality of struts and a resin material, which serves as the resistive element, may be interposed between the struts and the stage. The effect of noises can be reduced by the above simple structure.

In the above-described inspection apparatus, a resistance value between the stage and the work table may be equal to or higher than 1 MΩ. As a result, it is possible to reduce the current that leaks from the inspection panel to the GND through the work table and thereby to prevent the leaking current from causing noises which affect the measurement results.

The above-described inspection apparatus may further include a control unit that powers off a motor that drives the stage when an inspection signal is being supplied to the electrode through the probe. By powering off the motor, which could otherwise cause noises, the effect of noises can be reduced even further. In the above-described inspection apparatus, when the motor is powered off, a brake may be applied to the motor and the position of the work table may be thereby fixed. As a result, it is possible to prevent the position of the probe from being deviated.

Another exemplary aspect of the present invention is an inspection method by using an inspection apparatus including: a work table on which an object to be inspected is placed; a probe unit including a probe that comes into contact with the object placed on the work table; and a stage that moves the work table in order to bring the probe into contact with an electrode of the object placed on the work table, the inspection method including: driving the stage by a motor and thereby bringing the probe into contact with the electrode; and supplying an inspection signal to the electrode through the probe in a state where the motor is powered off. As a result, it is possible to reduce noises that occur during the inspection. In the above-described inspection method, when the motor is powered off, a brake may be applied to the motor and the position of the work table may be thereby fixed. As a result, it is possible to prevent the position of the probe from being deviated.

Further, in the above-described inspection method, the stage may be connected to ground and the stage may support the work table through a resistive element. This makes it possible to reduce the current that leaks from the inspection panel to the GND through the work table and thereby to reduce the effect of noises.

According to the present invention, it is possible to provide an inspection apparatus and an inspection method capable of reducing the effect of noises.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS (Overall Configuration)

Figure 1:
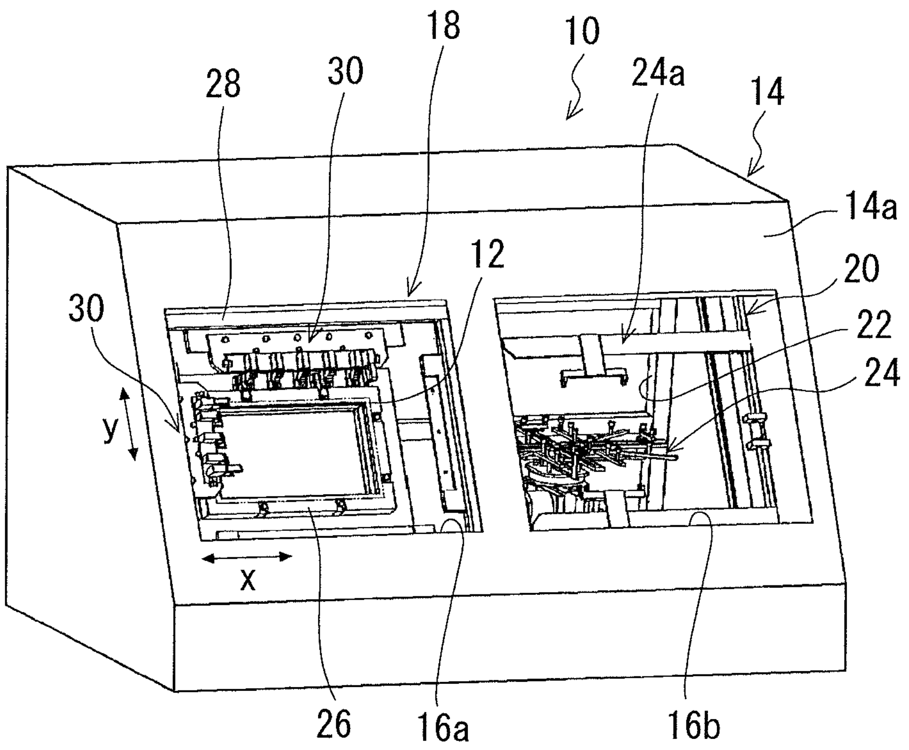
FIG. 1 is a perspective view showing an external appearance of an inspection apparatus.

FIG. 1 shows an external appearance of an inspection apparatus 10 for a panel to be inspected (hereinafter referred to as "inspection panel") according to an aspect of the present invention. This inspection apparatus 10 is used for, for example, a lighting inspection or an array inspection of an inspection panel 12 having a rectangular shape as viewed from the top. An example in which the inspection apparatus 10 is used for a lighting inspection is explained hereinafter. The inspection apparatus 10 includes a housing 14 including an inclined front surface 14*a*. On the inclined front surface 14*a* of the housing 14, a first window (opening) 16*a* for a lighting inspection and a second window (opening) 16*b* adjacent to the first window 16*a* are formed. The inspection panel 12 is an object to be inspected. For example, the inspection panel 12 is a display panel such as a liquid crystal panel and an organic EL (Electro-Luminescence) panel. Alternatively, the present invention can be applied to a circuit inspection of an X-ray flat pane detector or the like.

Inside the housing 14, an inspection station 18 for the lighting inspection of the inspection panel 12 is provided in a place corresponding to the first window 16*a*. Inside the housing 14, a panel handover station 20 is also provided next to the inspection station 18. The panel handover station 20 successively hands over/receives inspection panels 12 to/from the inspection station 18. For the panel handover station 20, a conventional well-known configuration can be used. The panel handover station 20 is disposed in a place corresponding to the second window 16*b*. The housing 14 is electrically connected to the GND (ground).

A number of electrodes are arranged on one of the surfaces of the inspection panel 12. For example, a plurality of electrodes are arranged along one of the long-side edges of the rectangular inspection panel 12. Further, a plurality of electrodes 12*a* are arranged along one of the short-side edges of the inspection panel 12. As is conventionally well-known in this field, the inspection panel 12, which will undergo a lighting inspection in the inspection station 18, is carried into a place on a panel handover apparatus 24 of the panel handover station 20. For example, a conveyance robot (not shown) carries an inspection panel 12 in a place on the panel handover apparatus 24 through an inlet/outlet 22 formed on the rear surface of the housing 14. Note that the inspection panel 12 is carried in the panel handover apparatus 24 in a state where its electrodes 12*a* face upward. This inspection panel 12 placed on the panel handover apparatus 24 is transferred to the inspection station 18 through a conveyance arm mechanism 24*a* of the panel handover apparatus 24. Then, a lighting inspection is performed for the inspection panel 12 in the inspection station 18. Further, the inspection panel 12, which has undergone the lighting inspection in the inspection station 18, is transferred back to the panel handover apparatus 24 by means of the conveyance arm mechanism 24*a* as is conventionally well-known in this field. Then, the conveyance robot takes out the inspection panel 12, which has been transferred to the panel handover apparatus 24, from the inspection apparatus 10.

As shown in FIG. 1, the inspection station 18 includes a work table 26 that holds an inspection panel 12 transferred from the panel handover station 20, a rectangular fixed frame body 28 that is a fixed plate disposed a certain distance away from the work table 26, and a plurality of probe units 30 supported on the fixed frame body 28.

The work table 26 is an inspection pedestal on which the inspection panel 12 is placed. The work table 26 holds the inspection panel 12 in such a manner that the electrodes 12*a* of the inspection panel 12 face the first window 16*a*. The inspection panel 12 placed on the work table 26 is held in a place inside the housing 14 corresponding to the first window 16*a*. The work table 26 is housed inside the housing 14. The work table 26 is supported by an XYZθ-support mechanism (not shown) disposed inside the housing 14. The XYZθ-support mechanism may be one similar to a conventional XYZθ-support mechanism. In this way, the two-dimensional position of the inspection panel 12 on the work table 26 can be adjusted in a unified manner with the work table 26. That is, the position of the inspection panel 12 can be adjusted in the XYZ-directions. Note that the X-direction and the Y-direction are orthogonal to each other in a plane parallel to the inclined front surface 14*a*. The Z-direction is orthogonal to the XY-plane. Further, the rotating posture of the inspection panel 12 around the Z-axis, i.e., its angle in the θ-direction can be adjusted.

In a place obliquely above the work table 26, i.e., a place that is located obliquely in front of the work table 26 as viewed from the work table 26 toward the inclined front surface 14*a* along the Z-axis, the fixed frame body 28 is fixed to the housing 14. For example, the fixed frame body 28, which serves as a fixed body, is disposed a certain distance away from the work table 26.

The probe units 30 are fixed to the fixed frame body 28. The probe units 30 are disposed so as to correspond to one of the long sides and one of the short sides of the rectangular inspection panel 12. That is, the probe units 30 are disposed along the sides of the inspection panel 12 on which the electrodes are disposed.

(Probe Unit)

Figure 2:
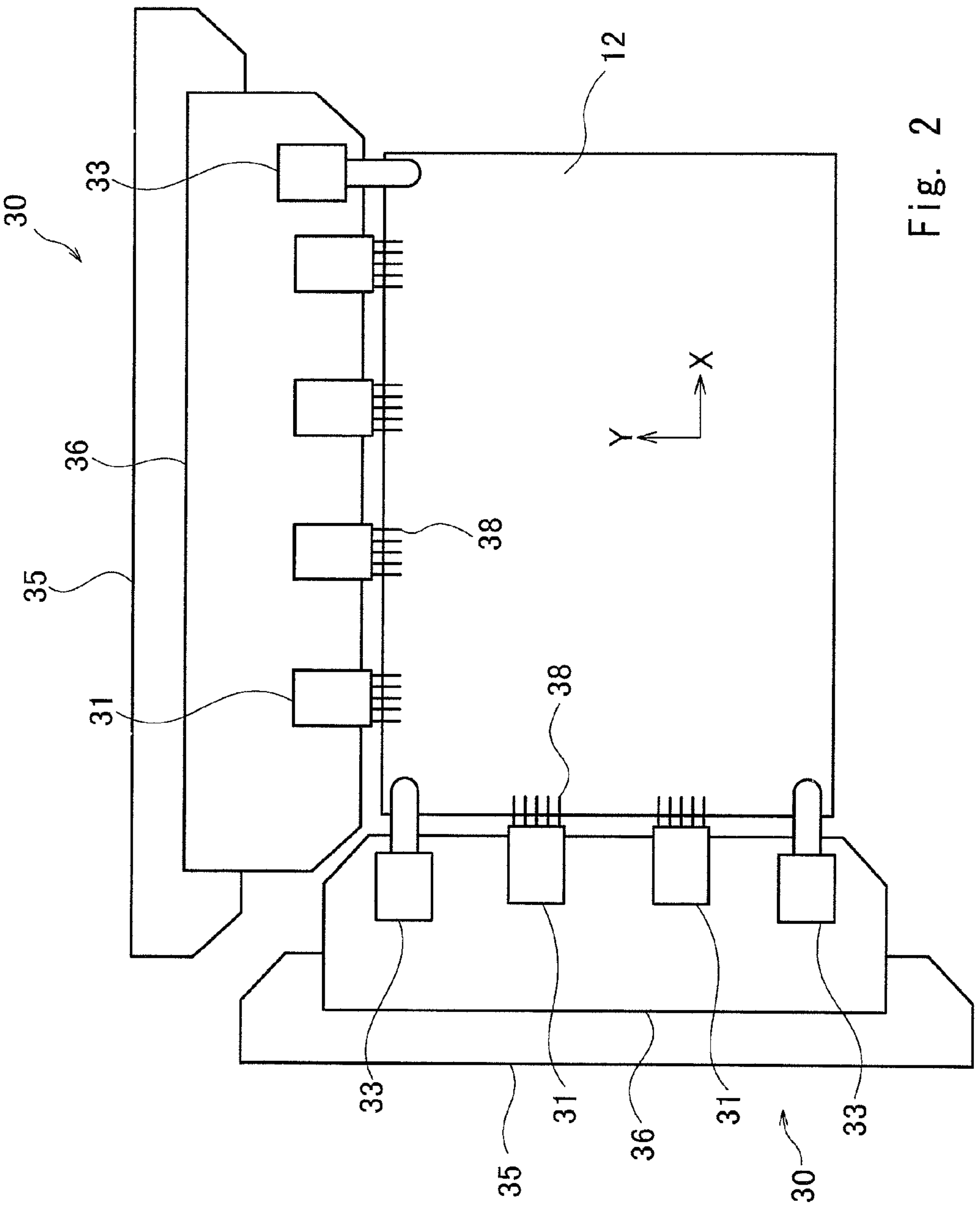
FIG. 2 is a plan view schematically showing a work table section of an inspection apparatus.

Next, a configuration of the probe units 30 is explained with reference to FIG. 2. FIG. 2 is a plan view showing a configuration of essential parts of the probe units 30 disposed on the work table 26. Further, the inspection panel 12 placed on the work table 26 is also shown in FIG. 2. In this example, the probe units 30 are disposed so as to correspond to one of the long sides and one of the short sides of the inspection panel 12. Therefore, the inspection apparatus 10 includes two probe units 30. Note that in FIG. 2, the long sides and the short sides of the inspection panel 12 are in parallel with the X-direction and the Y-direction, respectively. For example, the probe unit 30 disposed along the short side of the inspection panel 12 serves as a probe unit on the gate (scanning line) side, and the probe unit 30 disposed along the long side serves as a probe unit on the data (signal line) side.

Each probe unit 30 includes probe assemblies 31, a camera(s) 33, a probe stage plate 35, and a support base plate 36. The probe stage plate 35 is attached to the fixed frame body (fixed plate) 28 shown in FIG. 1. The support base plate 36 is attached to the probe stage plate 35. The probe stage plate 35 supports the support base plate 36. The support base plate 36 extends from the probe stage plate 35 toward the inspection panel 12.

The support base plate 36 supports a plurality of probe assemblies 31. The probe assemblies 31 are fixed on the inspection panel 12 side of the support base plate 36. In FIG. 2, the probe unit 30 on the data side includes four probe assemblies 31, and the probe unit 30 on the gate side includes two probe assemblies 31. Needless to say, there are no particular restrictions on the number and the configuration of the probe assemblies 31.

Each probe assembly 31 holds a plurality of probes 38. The plurality of probes 38 held in the probe assembly 31 are insulated from each other. Each probe 38 comes into contact with one of the electrodes of the inspection panel 12. As a result, inspection signals can be supplied from a tester to the inspection panel 12. The probes 38 protrude over the inspection panel 12 so that they come into contact with electrodes of the inspection panel 12. That is, the inspection panel 12 is disposed directly below the tips of the probes 38.

Further, the camera(s) 33 is disposed in the support base plate 36. The camera(s) 33 is fixed on the inspection panel 12 side of the support base plate 36. The camera(s) 33 takes an image of an alignment mark(s) and the like provided on the inspection panel 12. Further, the positioning of the inspection panel 12 and the probes 38 is performed according to a result of the image taken by the camera 33. That is, the work table 26 is positioned so that the probes 38 come directly above the electrodes of the inspection panel 12. In FIG. 2, one camera 33 is provided in the data-side probe unit 30 and two cameras 33 are provided in the gate-side probe unit 30. Needless to say, there are no particular restrictions on the number and the place of the camera(s) 33.

As described above, the inspection panel 12 is placed on the work table 26. Then, the work table 26 is moved so that the probes 38 come into contact with the electrodes of the inspection panel 12. For example, the work table 26 is moved according to the position of an alignment mark(s) of which the camera(s) 33 takes an image. As a result, the electrodes move to places where they can come into contact with the probes 38. Next, a configuration for moving the work table 26 is explained.

(Stage)

Figure 3:
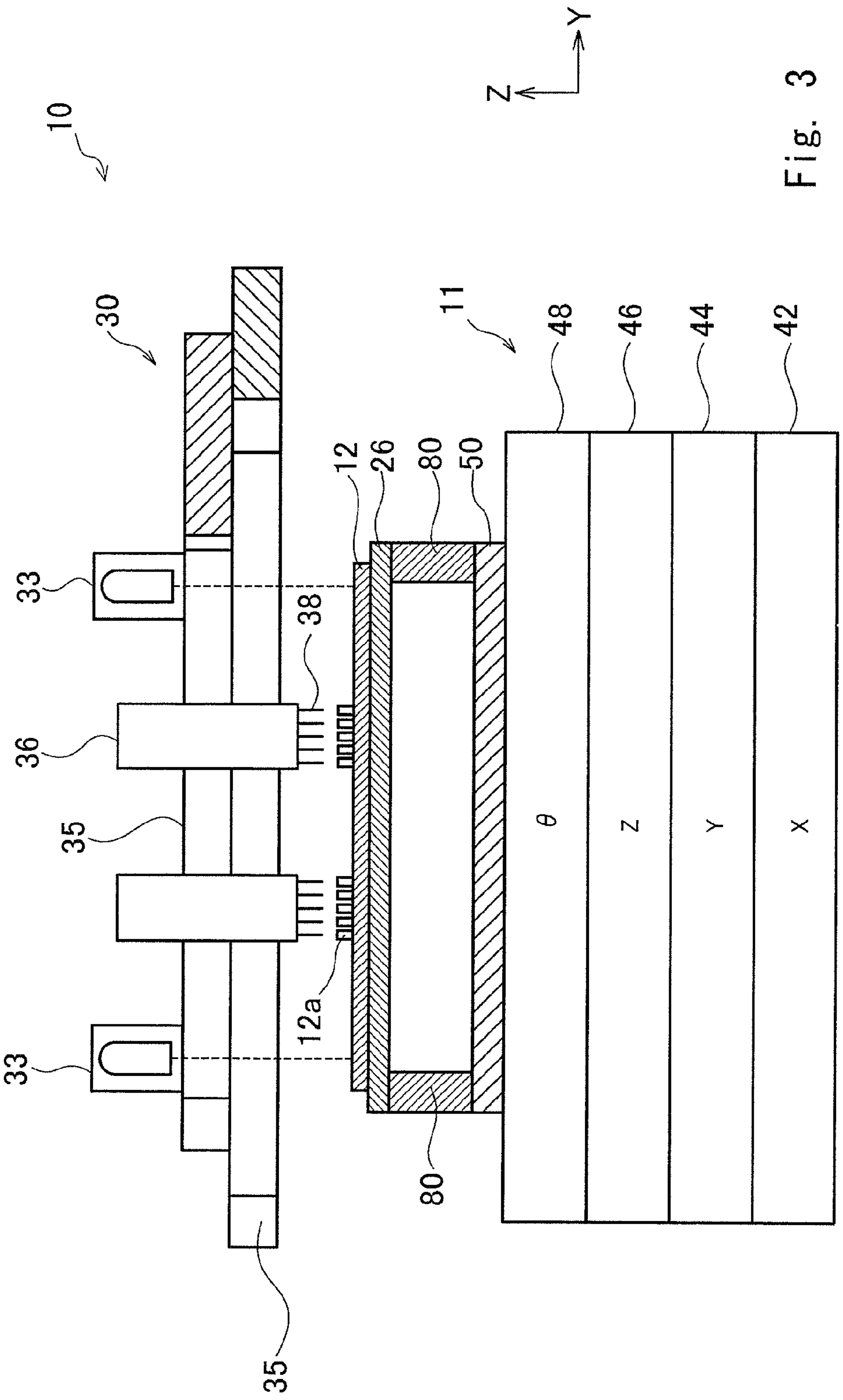
FIG. 3 schematically shows a work table section of an inspection apparatus.

FIG. 3 shows a configuration of an inspection apparatus and schematically shows a stage 11, which serves as an XYZθ-support mechanism for supporting the work table 26. Note that the stage 11 is an XYZθ-stage. That is, the stage 11 moves the work table 26 on a straight line in the X-, Y-, and Z-direction. Note that the Z-direction is orthogonal to the XY-plane. Further, the stage 11 rotates the work table 26 in the θ-direction, which is a rotating direction around the Z-axis. By doing so, the position of the work table 26 can be adjusted. That is, it is possible to obtain alignment so that the electrodes 12*a* of the inspection panel 12 come into contact with the probes 38.

The top surface of the work table 26 holds the inspection panel 12. The work table 26 is a flat plate disposed directly under the inspection panel 12. The work table 26 supports the entire bottom surface of the inspection panel 12. The electrodes 12*a* are disposed on the top surface of the inspection panel 12. The stage 11 is disposed below the work table 26 and supports the work table 26. The stage 11 includes an X-drive pedestal 42, a Y-drive pedestal 44, a Z-drive pedestal 46, a θ-rotating pedestal 48, and a top plate 50. Each of the X-drive pedestal 42, the Y-drive pedestal 44, the Z-drive pedestal 46, and the θ-rotating pedestal 48 includes a servomotor, a guide mechanism, and so on.

The θ-rotating pedestal 48 is disposed on the Z-drive pedestal 46. The Z-drive pedestal 46 is disposed on the Y-drive pedestal 44. The Y-drive pedestal 44 is disposed on the X-drive pedestal 42. The top plate 50 is disposed on the θ-rotating pedestal 48. The stage 11 moves the top plate 50. The work table 26 is disposed above the top plate 50. The order of the X-drive pedestal 42, the Y-drive pedestal 44, the Z-drive pedestal 46, and the θ-rotating pedestal 48 is not limited to the one shown in FIG. 2. Each of the work table 26, the top plate 50, the X-drive pedestal 42, the Y-drive pedestal 44, the Z-drive pedestal 46, and the θ-rotating pedestal 48 is formed by a conductor such as stainless steel or aluminum. Further, the stage 11 is electrically connected to the GND through the housing 14 shown in FIG. 1.

The top plate 50 supports the work table 26. More specifically, support members 80 are disposed between the top plate 50 and the work table 26. The support members 80 are attached on the edges of the top plate 50. Further, the top ends of the support members 80 are fixed to the work table 26 and the bottom ends are fixed to the top plate 50. In this manner, the top plate 50 supports the work table 26 through the support members 80. Therefore, the inspection panel 12 disposed on the work table 26 moves in accordance with the movement of the top plate 50.

The X-drive pedestal 42 moves the top plate 50 on a straight line in the X-direction. This enables alignment in the X-direction. The Y-drive pedestal 44 moves the top plate 50 on a straight line in the Y-direction. This enables alignment in the Y-direction. The Z-drive pedestal 46 moves the top plate 50 in the Z-direction. This makes it possible to change the distance between the inspection panel 12 and the probes 38. That is, it is possible to bring the probes 38 into contact with the electrodes 12*a* of the inspection panel 12 or move the probes 38 away from the electrodes 12*a*. The θ-rotating pedestal 48 rotates the top plate 50 in the θ-direction, i.e., around the Z-axis. This enables alignment in the θ-direction, thereby making it possible to adjust (i.e., eliminate) the deviation between the inclination of the inspection panel 12 and that of the work table 26.

Similarly to the top plate 50 and so on, the work table 26 is formed by a conductor such as stainless steel. As described later, the support member 80 includes a resistive element having a high resistance value. The resistive element is interposed between the top plate 50 and the work table 26. As a result, the resistance value between the work table 26 and the stage 11 can be increased. Since the stage 11 is connected to the ground, the work table 26 is connected to the GND through the resistive element.

Figure 10:
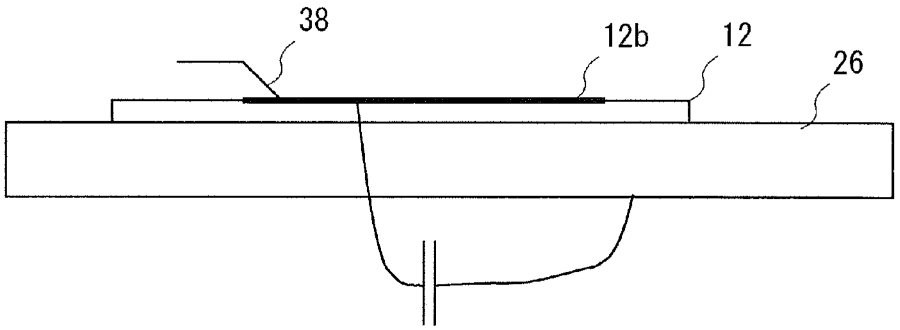
FIG. 10 shows connection between a work table and the ground.

In this way, it is possible to reduce the current leaking through the capacitive coupling. For example, assuming that the inspection panel 12 is a glass substrate having a device pattern formed thereon, a capacitive coupling is formed between the work table 26 and the device pattern (see FIG. 10). The provision of the resistive element between the GND and the work table 26 can reduce the current leaking through the capacitive coupling and thereby reduce the effect of measurement noises.

(Support Structure)

Figure 4:
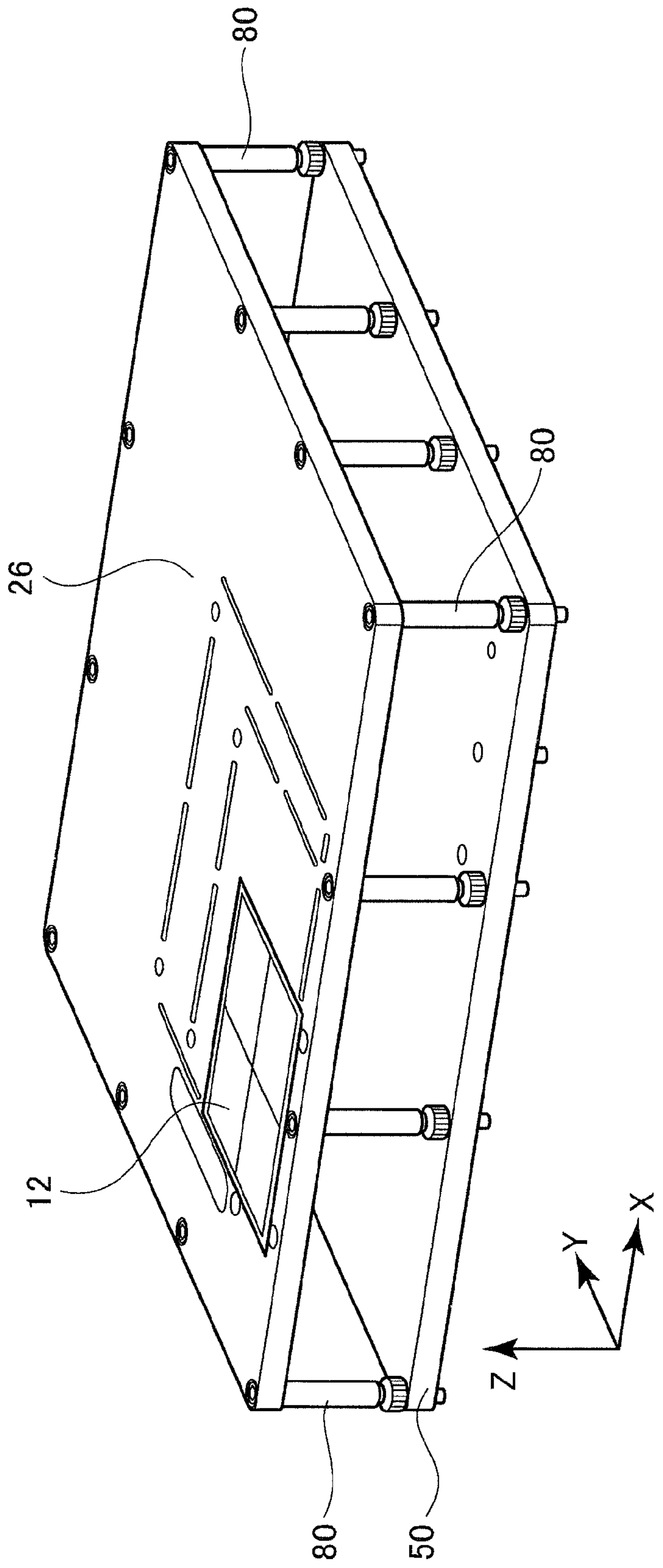
FIG. 4 is a perspective view showing a fixing section between a work table and a stage of an inspection apparatus.

Next, the support members 80 disposed between the top plate 50 and the work table 26 are explained with reference to FIG. 4. FIG. 4 is a perspective view showing a structure for fixing the top plate 50 and the work table 26 to each other.

As shown in FIG. 4, the work table 26 is disposed above the top plate 50. The top plate 50 and the work table 26 are rectangular plates having roughly the same size. The rectangular inspection panel 12 is placed on the work table 26. Each of the top plate 50 and the work table 26 is formed by a conductor. For example, each of the top plate 50 and the work table 26 is a metal plate made of stainless steel or the like. In this way, it is possible to reduce the bending effect of the work table 26 and the top plate 50.

A plurality of support members 80 are disposed between the top plate 50 and the work table 26. Each of the support members 80 includes a strut and so on, and the support members 80 fix the top plate 50 and the work table 26 to each other. The top plate 50 and the work table 26 are disposed in parallel with each other with a constant interval therebetween. The plurality of support members 80 are arranged along the edges of the work table 26. In this example, four support members 80 are disposed at regular intervals along each side of the work table 26. Needless to say, a support member(s) 80 may be disposed at the center of the work table 26. Note that there are no particular restrictions on the number and the configuration of the support members 80.

Figure 5:
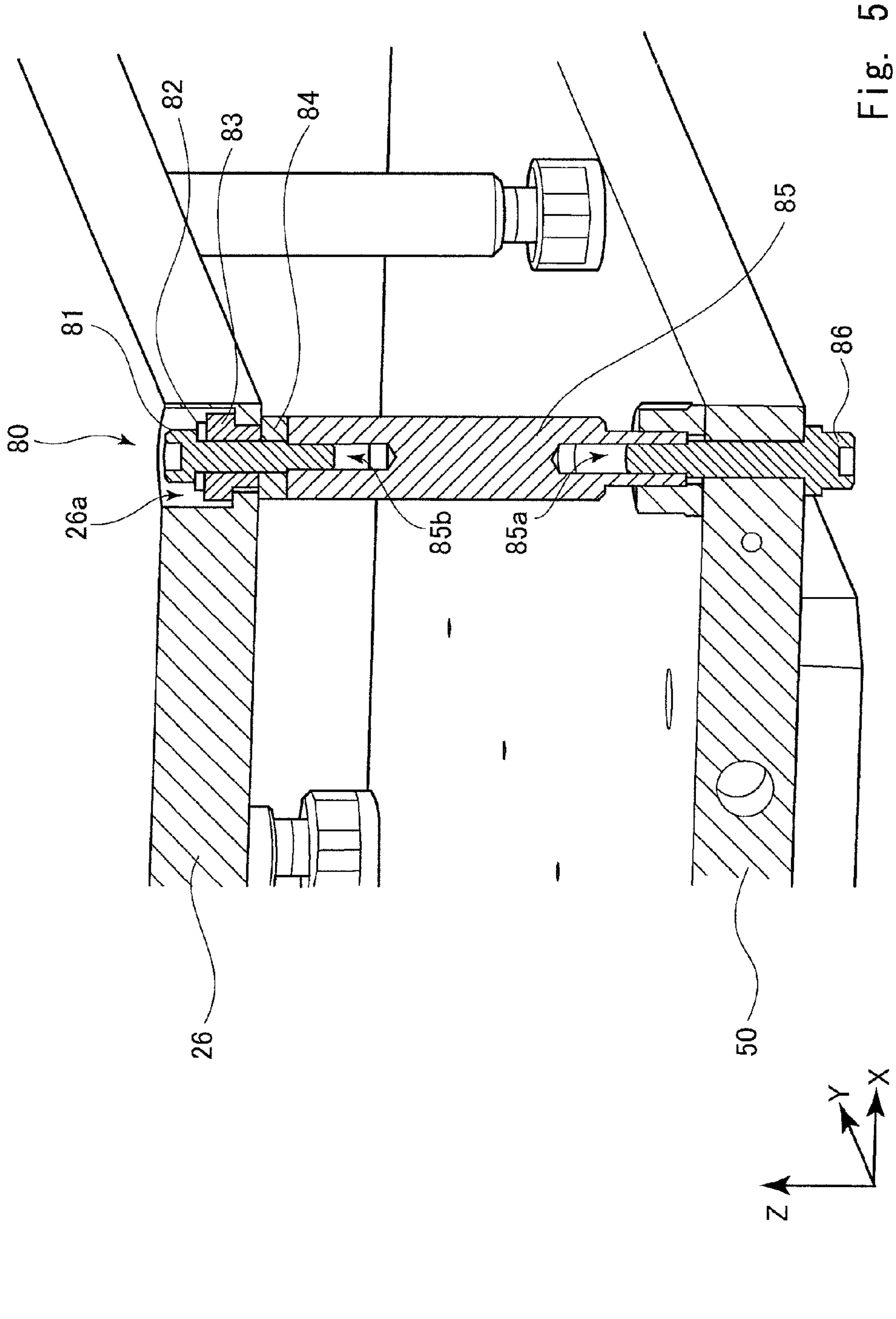
FIG. 5 is a cross section showing a fixing structure by a support section.

A configuration of a support member 80 is explained hereinafter in detail with reference to FIG. 5. FIG. 5 is a partial cross section showing a fixing mechanism by using a support member 80 in detail. The support member 80 includes a top bolt 81, a flat washer 82, a resin collar 83, a resin washer 84, a strut 85, and a bottom bolt 86.

The strut 85 is formed in a pillar shape whose longitudinal direction coincides with the Z-direction. A threaded hole 85*b* is formed on the top end surface of the strut 85 and another threaded hole 85*a* is formed on the bottom end surface. Further, a through-hole 26*a* is formed on an edge of the work table 26. A counterbore is formed in the through-hole 26*a*. The top bolt 81 is inserted from the top surface side of the work table 26 into the through-hole 26*a*. Then, the top bolt 81 is screwed into the threaded hole 85*b* formed in the strut 85. As a result, the strut 85 is attached to the work table 26. Each of the top bolt 81 and the strut 85 is formed by a conductor such as stainless steel.

Further, the resin collar 83 is disposed inside the through-hole 26*a* in which the counterbore is formed. The resin collar 83 includes a step conforming to the shape of the counterbore of the through-hole 26*a*. The resin collar 83 is interposed between the work table 26 and the strut 85. Further, the flat washer 82, which is formed by a conductor such as stainless steel, is disposed between the resin collar 83 and the head of the top bolt 81. Further, on the periphery of the bottom of the through-hole 26*a*, the resin washer 84 is disposed between the work table 26 and the strut 85.

Therefore, the top bolt 81 passes through the flat washer 82, the resin collar 83 and the resin washer 84, and is screwed into the threaded hole 85*b* of the strut 85. Note that inside the through-hole 26*a*, the resin collar 83 is disposed between the outer peripheral surface of the top bolt 81 and the work table 26. Further, the resin washer 84 is interposed between the bottom surface of the work table 26 and the strut 85. The work table 26 is not in contact with conductors such as the strut 85 and the top bolt 81. Therefore, the strut 85 is attached to the work table 26 without being electrically connected to the work table 26.

Further, the threaded hole 85*a* is formed at the bottom end of the strut 85. The bottom bolt 86 passes through the top plate 50 from its bottom side, and is screwed into the threaded hole 85*a*. As a result, the strut 85 is attached to the top plate 50. As described above, the threaded holes 85*a* and 85*b* are formed on the bottom end and the top end, respectively, of the strut 85. Then, the top bolt 81, which passes through the work table 26, is screwed into the threaded hole 85*b*, and the bottom bolt 86, which passes through the top plate 50, is screwed into the threaded hole 85*a*. All the support members 80 have a structure similar to the one shown in FIG. 5. In this way, the top plate 50 and the work table 26 are fixed to each other through the support members 80.

Note that the resin collar 83 is formed by, for example, a resin material such as polyacetal. Further, the resin washer 84 is formed by a resin material such as DURACON (registered trademark). Therefore, there is an electrical resistance between the strut 85 and the work table 26. In other words, the resin collar 83 and the resin washer 84 serve as resistive elements.

The materials for the resin collar 83 and the resin washer 84 are not limited to the above-described materials. Examples of the materials include other resistive materials (insulating materials) such as plastics, acryl, fluorocarbon resins, Teflon (registered trademark), vinyl chloride, rubber, glass epoxy resins, phenolic resins, ceramics, and glass. That is, the only requirement is that the work table 26 and the top plate 50 should be fixed to each other by using a material having a high resistance.

Figure 6:
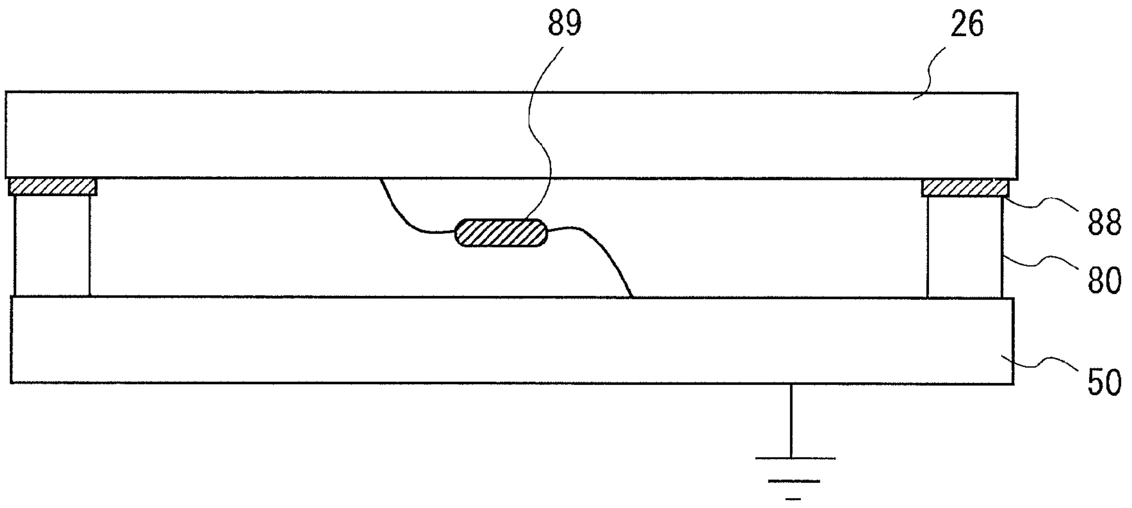
FIG. 6 schematically shows connection between a work table and the ground.

FIG. 6 shows an electrical connection between the work table 26 and the GND. Each of the support members 80 includes a resin material 88 such as the resin collar 83 and the resin washer 84. Further, the support members 80 support the work table 26 by using the resin material 88. That is, the top plate 50 supports the work table 26 through the resin material 88. The top plate 50 is connected to the GND. In other words, the work table 26 is connected to the GND through a resistive element 89. Note that resin material 88 such as the resin collar 83 and the resin washer 84 serves as the resistive element 89.

The resistance value between the work table 26 and the top plate 50 is preferably equal to or higher than 1 MΩ. As described above, the work table 26 is connected to the GND through the resistive element 89 having a high resistance. As a result, it is possible to reduce the current that leaks from the inspection panel 12 to the GND through the work table 26. Therefore, the effect of measurement noises can be reduced.

Alternatively, the resistance value between the work table 26 and the top plate 50 is preferably equal to or lower than 100 MΩ. As a result, it is possible to prevent the work table 26 from being electrically charged. Therefore, it is possible to prevent an electric discharge between the electrically charged work table 26 and the inspection panel 12 during the inspection. This makes it possible to prevent the inspection panel 12 from being broken, prevent measurement noises from occurring, and so on. Note that in this exemplary embodiment, the resistance value between the work table 26 and the top plate 50 is around 10 MΩ. As described above, a desired resistance can be obtained with a simple structure by fixing the struts 85 to the work table 26 through the resin material 88.

Note that although the resin collar 83 and the resin washer 84 are disposed between the work table 26 and the strut 85 in the above explanation, the resin collar 83 and the resin washer 84 may be disposed between the top plate 50 and the struts 85. Further, another resin collar 83 and another resin washer 84 may be disposed between the top plate 50 and the strut 85 in addition to those disposed between the work table 26 and the strut 85. Further, the fixing structure between the top plate 50 and the work table 26 is not limited to structures using the struts 85 and the bolts.

(Power Supply Control)

Figure 7:
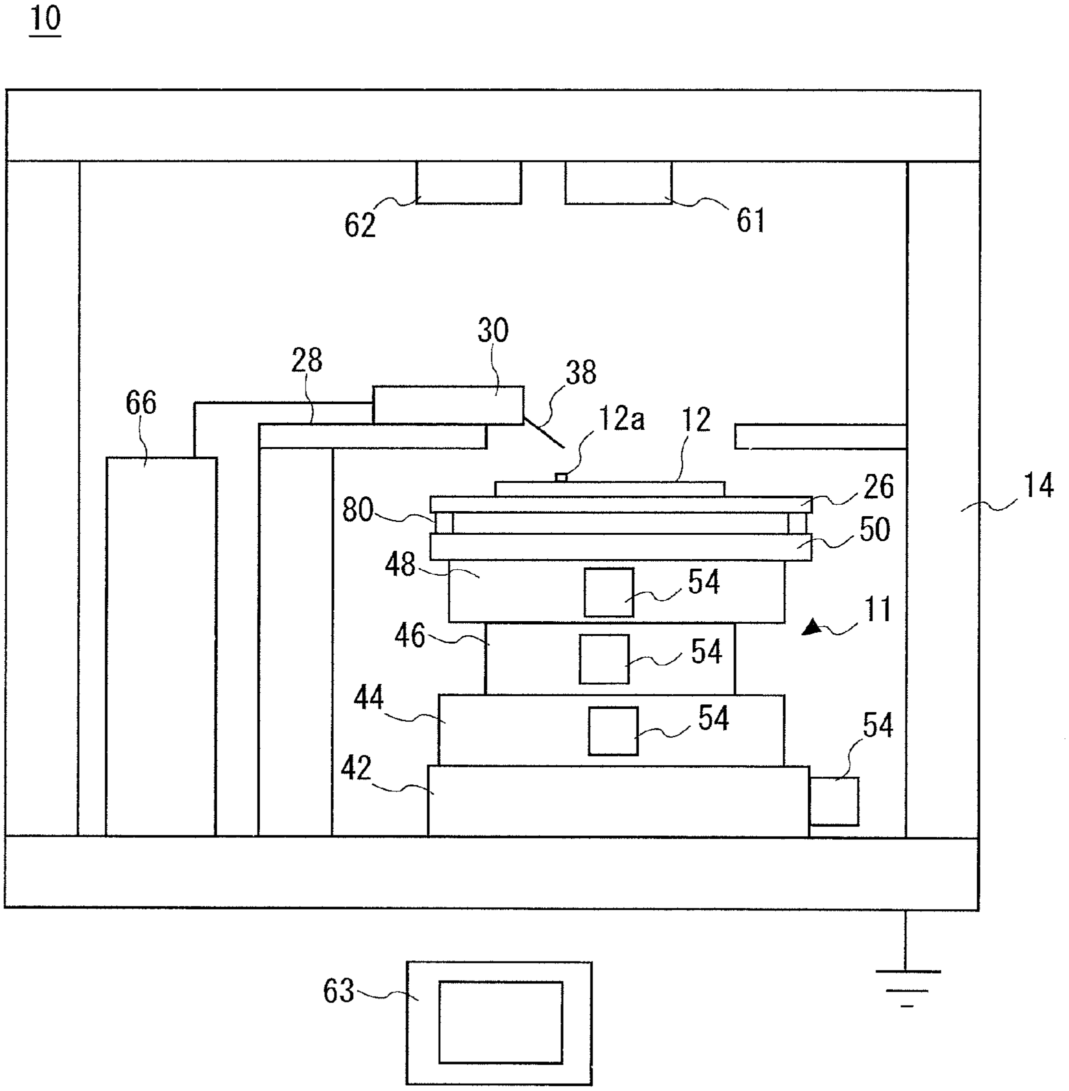
FIG. 7 schematically shows a configuration of an inspection apparatus.

Further, in this exemplary embodiment, the electric device(s) is powered off during the inspection in order to reduce the measurement noises. A configuration for controlling the power supply is explained hereinafter with reference to FIG. 7. FIG. 7 schematically shows an overall configuration of the inspection apparatus 10. Note that explanations of the components/structures that have already been explained above with reference to FIGS. 1 to 6 may be omitted as appropriate.

As shown in FIG. 7, the housing 14 is connected to the GND. The stage 11 is connected to the GND through the conductive housing 14. The housing 14 houses therein the stage 11, the work table 26, the probe units 30, the fixed frame body 28, a tester 66, an ionizer 61, and a top light 62. Note that the tester 66 may be disposed outside the housing 14. Further, a monitor 63 for displaying the state of the inspection apparatus 10 is disposed outside the housing 14. The stage 11 includes motors 54 for moving the stage 11 in the XYZθ-directions. Note that the motors 54 are, for example, servomotors and are provided for the XYZθ-directions, respectively. That is, the motors 54 serve as actuators for driving the stage 11 in the respective directions.

The ionizer 61 and the top light 62 are disposed above the work table 26. The ionizer 61 generates ions to remove electrical charges on the inspection panel 12. The top light 62 illuminates inside the housing 14. That is, the top light 62 includes an illumination light source that illuminates the inspection panel 12 and so on.

The tester 66 supplies inspection signals (drive signals) to the electrodes 12*a* of the inspection panel 12 through the probes 38. Further, the tester 66 measures a measurement current(s) flowing through the circuit of the inspection panel 12. In this way, the inspection panel 12 is inspected.

Figure 8:
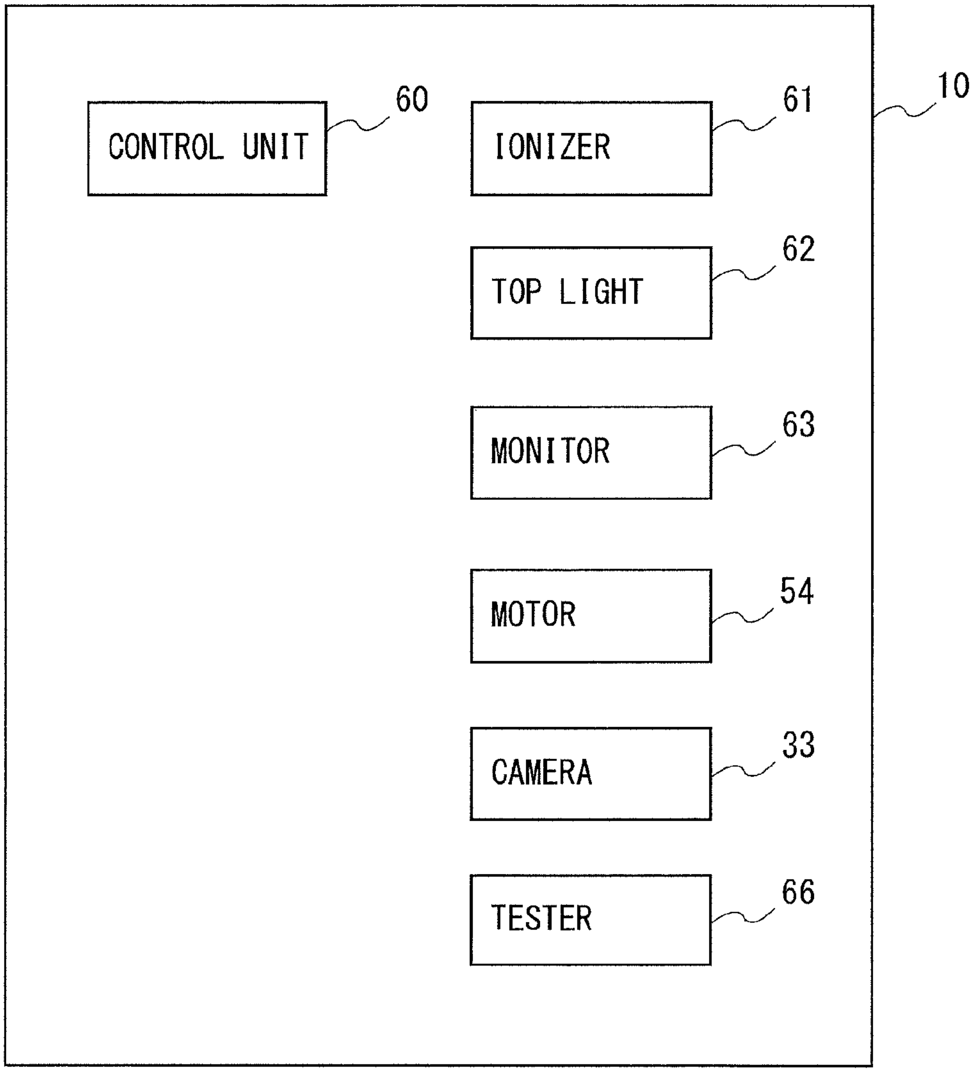
FIG. 8 is a control block diagram showing a control system of an inspection apparatus.

FIG. 8 is a block diagram showing a configuration of electric devices in the inspection apparatus 10. As described above, the inspection apparatus 10 includes the motors 54, the ionizer 61, the top light 62, the monitor 63, and the tester 66. The inspection apparatus 10 also includes the cameras 33 for alignment shown in FIGS. 2 and 3. Therefore, the inspection apparatus 10 includes electric devices such as the ionizer 61, the top light 62, the monitor 63, the motors 54, and the cameras 33. Note that in FIG. 8, a plurality of motors 54 and a plurality of camera 33 are illustrated as single components.

Further, the inspection apparatus 10 includes a control unit 60. The control unit 60 controls the motors 54, the ionizer 61, the top light 62, the monitor 63, the tester 66, and the cameras 33. For example, the control unit 60 turns on/off the motors 54, the ionizer 61, the top light 62, the monitor 63, the tester 66, and the cameras 33 at appropriate timings. When the the control unit 60 turns off the motors 54, the ionizer 61, the top light 62, the monitor 63, the tester 66, and the cameras 33, the operation of each device stops. As a result, each device becomes an off-state.

An example of a control method according to this exemplary embodiment is explained hereinafter in detail. An inspection panel 12 is placed on the work table 26 in a state where the ionizer 61, the top light 62, the monitor 63, and so on are in on-states. Then, the cameras 33 take an image(s) of the inspection panel 12 placed on the work table 26. The motors 54 are driven based on the result of the image taken by the cameras 33, and alignment is thereby performed. As a result, the probes 38 come into contact with the electrodes 12*a*.

When the the probes 38 come into contact with the electrodes 12*a*, the control unit 60 turns off the electric devices. That is, the control unit 60 stops the operations of the motors 54, the ionizer 61, the top light 62, the monitor 63, and the cameras 33. As a result, only the tester 66 remains in the on-state and continues operating. The tester 66 supplies inspection signals (drive signals) to the electrodes 12*a*. Further, the tester 66 measures a current(s) flowing through the circuit according to the inspection signals. In this way, the inspection panel 12 is inspected.

When the inspection has been completed and the tester 66 stops the supply of the inspection signals, the control unit 60 turns on the motors 54, the ionizer 61, the top light 62, the monitor 63 and so on again. By doing so, it is possible to reduce the effect of noises caused by the electric devices such as the motors 54. The electric devices, which cause noises, are powered off during the inspection. Therefore, it is possible to prevent noises, which would otherwise be caused by the operations of the electric devices, from affecting the measurement.

Note that although the control unit 60 powers off the motors 54, the ionizer 61, the top light 62, the monitor 63, and the cameras 33 after the alignment using the cameras 33 in the above explanation, the timing of the power-off is not limited to any particular timings. That is, the only requirement is that these electric devices should be in off-states during the inspection performed by the tester 66. Further, all the electric devices do not necessarily have to be powered off. That is, only some of the electric devices may be powered off. In this case, electric devices that have large noise effects are preferably turned off. For example, the control unit 60 preferably turns off the motors 54 that have large electric currents.

Note that the position of the work table 26 needs to be fixed during the inspection because the electrodes 12*a* of the inspection panel 12 are in contact with the probes 38 during the inspection. That is, it is necessary to regulate the position of the stage 11 so that the work table 26 does not move during the inspection. Even when the motors 54 are in off-states, it is still necessary to apply a brake so that the X-drive pedestal 42, the Y-drive pedestal 44, the Z-drive pedestal 46, and the θ-rotating pedestal 48 are not moved. By doing so, it is possible to prevent any contact deviation from occurring during the inspection. Therefore, the stage 11 includes a drive mechanism capable of applying a brake to each of the drive pedestals and the θ-rotating pedestal when the motors 54 are in off-states.

Figure 9:
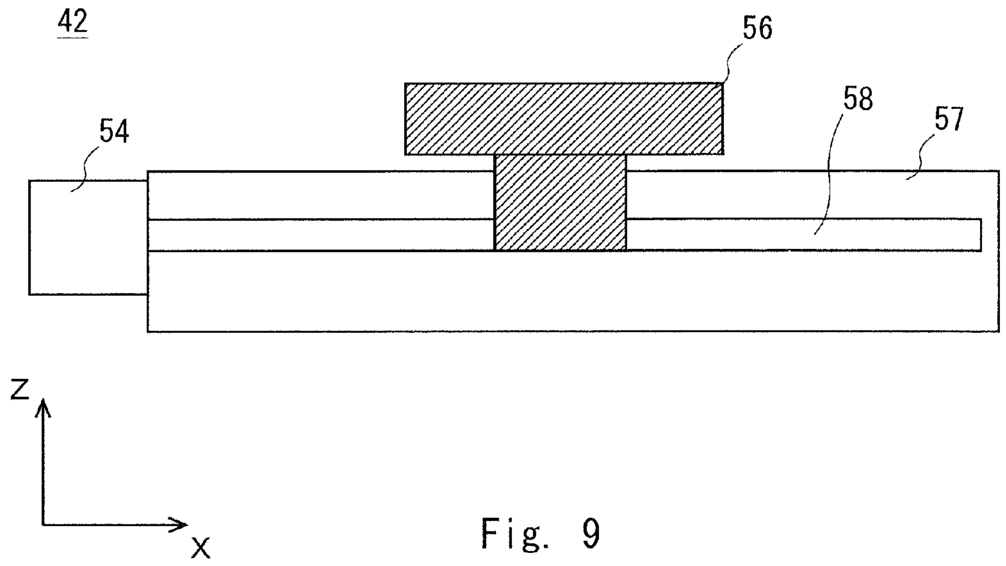
FIG. 9 schematically shows a drive mechanism of a stage.

A drive mechanism of the stage 11 is explained hereinafter with reference to FIG. 9. FIG. 9 schematically shows a configuration of the X-drive pedestal 42. In the following explanation, the X-drive pedestal 42 is explained as a typical example of the drive mechanisms of the stage 11. However, it should be noted that each of the Y-drive pedestal 44, the Z-drive pedestal 46, and the θ-rotating pedestal 48 has a similar configuration except for the guide direction.

The X-drive pedestal 42 includes a fixed member 57, a movable member 56, and a motor 54. Further, a guide mechanism 58 is provided on a side of the fixed member 57. The guide mechanism 58 has a guide groove(s) or the like along the X-direction. When the motor 54 is driven, the movable member 56 moves along the guide groove 68. As a result, the position of the movable member 56 with respect to the fixed member 57 changes. The movable member 56 supports the Y-drive pedestal 44, the Z-drive pedestal 46, and the θ-rotating pedestal 48. When the motor 54 is driven, the positions of the Y-drive pedestal 44, the Z-drive pedestal 46, and the θ-rotating pedestal 48 in the X-direction change. By doing so, the position of the inspection panel 12 disposed on the work table 26 can be adjusted.

As described above, the position of the motor 54 is fixed when it is powered off. Therefore, a motor with a magnetic brake may be used as the motor 54. In the motor with a magnetic brake, when the voltage to the coil is cut off, a braking force is produced by a spring force, thus bringing the motor shaft into a standstill state.

The movable member 56 is fixed when the motor 54 is powered off. Even when the motor 54 is powered off, the position of the movable member 56 with respect to the fixed member 57 does not change. Even when an external force is applied to the stage 11, the work table 26, or the like when the motor 54 is in an off-state, no position deviation occurs. Therefore, the contact deviation during the inspection is prevented. The probes 38 can be reliably brought into contact with the electrodes 12*a*.

As described above, the stage 11 is connected to the ground and supports the work table 26 through the resistive element(s) interposed therebetween in this exemplary embodiment. With this structure, even when a capacitive coupling is formed between the inspection panel 12 and the work table 26, the current that leaks from the inspection panel 12 to the GND can be reduced. Therefore, it is possible to prevent the leaking current from causing noises and from affecting the measurement results. This can reduce the effect of noises, thus enabling an accurate inspection.

Further, the insulating material, which serves as the resistive element, is interposed between the work table 26 and the strut 85. This structure enables a simple fixing structure. Further, the resistance between the work table 26 and the stage 11 is preferably equal to or higher than 1 MΩ. As a result, it is possible to reduce the current that leaks from the inspection panel 12 to the GND through the work table 26. Therefore, the effect of measurement noises can be reduced even further.

Further, in this exemplary embodiment, the motors 54, which drive the stage 11, are powered off when inspection signals are supplied to the electrodes 12*a* through the probes 38. That is, in the inspection method according to this exemplary embodiment, the motors 54 are turned off after the probes 38 are brought into contact with the electrodes 12*a*. Then, the tester 66 supplies inspection signals to the electrodes 12*a* through the probes 38 and an inspection is thereby performed while maintaining the motors 54 in the off-states. By maintaining the motors, which would otherwise cause noises, in the off-states during the inspection, the effect of noises can be reduced even further.

As described above, leak currents caused by noises can be suppressed in this exemplary embodiment. In this way, it is possible to perform an inspection under a low-noise environment. Therefore, an inspection can be performed without increasing the number of samplings for the measurement, which would be otherwise necessary to average noise effects. Consequently, measurement can be performed in a short time. Further, it is possible to prevent such a situation that a noise larger than the permissible level occurs and prevents a desired measurement result from being obtained, thus enabling an accurate inspection.

Although the inspection apparatus 10 that performs a lighting inspection for the inspection panel 12 such as a liquid crystal panel is explained in the above explanation, this exemplary embodiment can also be applied to inspection apparatuses that perform inspections other than the lighting inspection. For example, an array inspection can be performed for a TFT substrate of a liquid crystal panel. By performing an array inspection, a circuit(s) provided in the inspection panel 12 can be inspected. For example, in the array inspection, an inspection apparatus supplies drive signals to a mother glass substrate through probes 38 before the mother glass substrate is cut into a plurality of sections. Further, an array inspection for a circuit(s) can also be performed for a detector panel such as an XRAY flat panel detector by using a similar technique.

Although exemplary embodiments according to the present invention have been explained above, the present invention also includes various modifications that do not substantially impair the purposes and the advantages of the present invention. Further, the above-described exemplary embodiments should not be used to limit the scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An inspection apparatus comprising:

a work table on which an object to be inspected is placed;

a probe unit including a probe that comes into contact with the object placed on the work table; and a stage that moves the work table in order to bring the probe into contact with an electrode of the object placed on the work table, wherein the stage is connected to ground, and the stage supports the work table through a resistive element including a resin material positioned between the stage and the work table.

2. The inspection apparatus according to claim 1, wherein the stage supports the work table through a plurality of struts, and the resin material is interposed between the struts and the stage.

3. The inspection apparatus according to claim 1, wherein a resistance value between the stage and the work table is equal to or higher than 1 MΩ.

4. The inspection apparatus according to claim 1, further comprising a control unit that powers off a motor that drives the stage when an inspection signal is being supplied to the electrode through the probe.

5. The inspection apparatus according to claim 4, wherein when the motor is powered off, a brake is applied to the motor and the position of the work table is thereby fixed.

6. An inspection method by using an inspection apparatus comprising: a work table on which an object to be inspected is placed; a probe unit including a probe that comes into contact with the object placed on the work table; and a stage that moves the work table in order to bring the probe into contact with an electrode of the object placed on the work table, the inspection method comprising:

driving the stage by a motor and thereby bringing the probe into contact with the electrode; and supplying an inspection signal to the electrode through the probe in a state where the motor is powered off, wherein the stage is connected to ground, and wherein the stage supports the work table through a resistive element including a resin material positioned between the stage and the work table.

7. The inspection method according to claim 6, wherein when the motor is powered off, a brake is applied to the motor and the position of the work table is thereby fixed.

8. The inspection method according to claim 7, wherein the stage supports the work table through a plurality of struts, and the resin material is interposed between the struts and the stage.

9. The inspection apparatus according to claim 1, wherein the work table and the stage are disposed with an interval.

10. The inspection apparatus according to claim 1, wherein the work table is formed by a conductor.

11. The inspection method according to claim 6, wherein the work table and the stage are disposed with an interval.

12. The inspection method according to claim 6, wherein the work table is formed by a conductor.

* * * * *